(12) United States Patent
Kato et al.

(10) Patent No.: US 6,414,485 B1
(45) Date of Patent: Jul. 2, 2002

(54) MAGNETIC RESONANCE SIGNAL RECEIVING APPARATUS AND MAGNETIC RESONANCE IMAGING APPARATUS

(75) Inventors: Yasushi Kato; Takashi Ishiguro, both of Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 09/692,865

(22) Filed: Oct. 19, 2000

(30) Foreign Application Priority Data

Nov. 19, 1999 (JP) ............................................. 11-329071

(51) Int. Cl.[7] ................................................ G01V 3/00
(52) U.S. Cl. .......................... 324/307; 324/309; 324/312
(58) Field of Search ................................. 324/318, 322, 324/300, 307, 309, 312

(56) References Cited

U.S. PATENT DOCUMENTS

| 5,144,243 A | * | 9/1992 | Nakabayashi et al. | ....... 324/318 |
| 5,521,506 A | * | 5/1996 | Misic et al. | ................ 324/322 |
| 5,757,189 A | * | 5/1998 | Molyneaux et al. | ........ 324/318 |

* cited by examiner

Primary Examiner—Edward Lefkowitz
Assistant Examiner—Brij B. Shrivastav
(74) Attorney, Agent, or Firm—Moonray Kojima

(57) ABSTRACT

In order to provide a magnetic resonance signal receiving apparatus with simplified arrangement of a coil loop selecting means, an active disabling circuit by the diode and a passive disabling circuit by the inductor connected in parallel to the capacitor through a pair of inverted heading parallel diodes are provided to a plurality of unit coils forming a phased array, the active disabling circuit will be controlled by the bias driver unit.

12 Claims, 10 Drawing Sheets

FIG. 6A

| | Transmission | Reception |
|---|---|---|
| Enabled side | Forward | Forward |
| Disabled side | Forward | Reverse |

FIG. 6B

| | Transmission | Reception |
|---|---|---|
| Enable side | Forward | Forward |
| Disabled side | Reverse | Reverse |

FIG. 6C

| | Transmission | Reception |
|---|---|---|
| Enable side | Reverse | Forward |
| Disabled side | Reverse | Reverse |

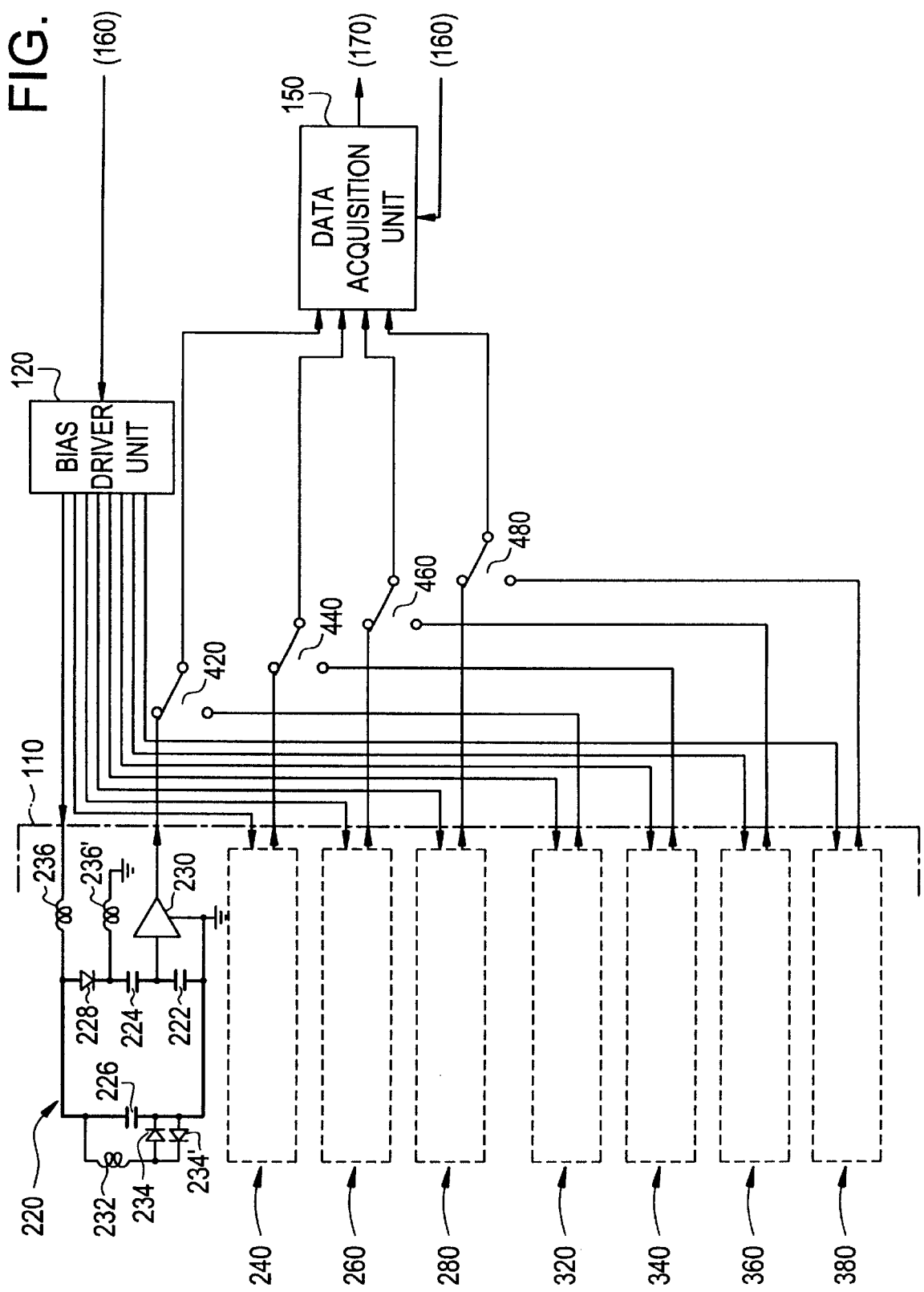

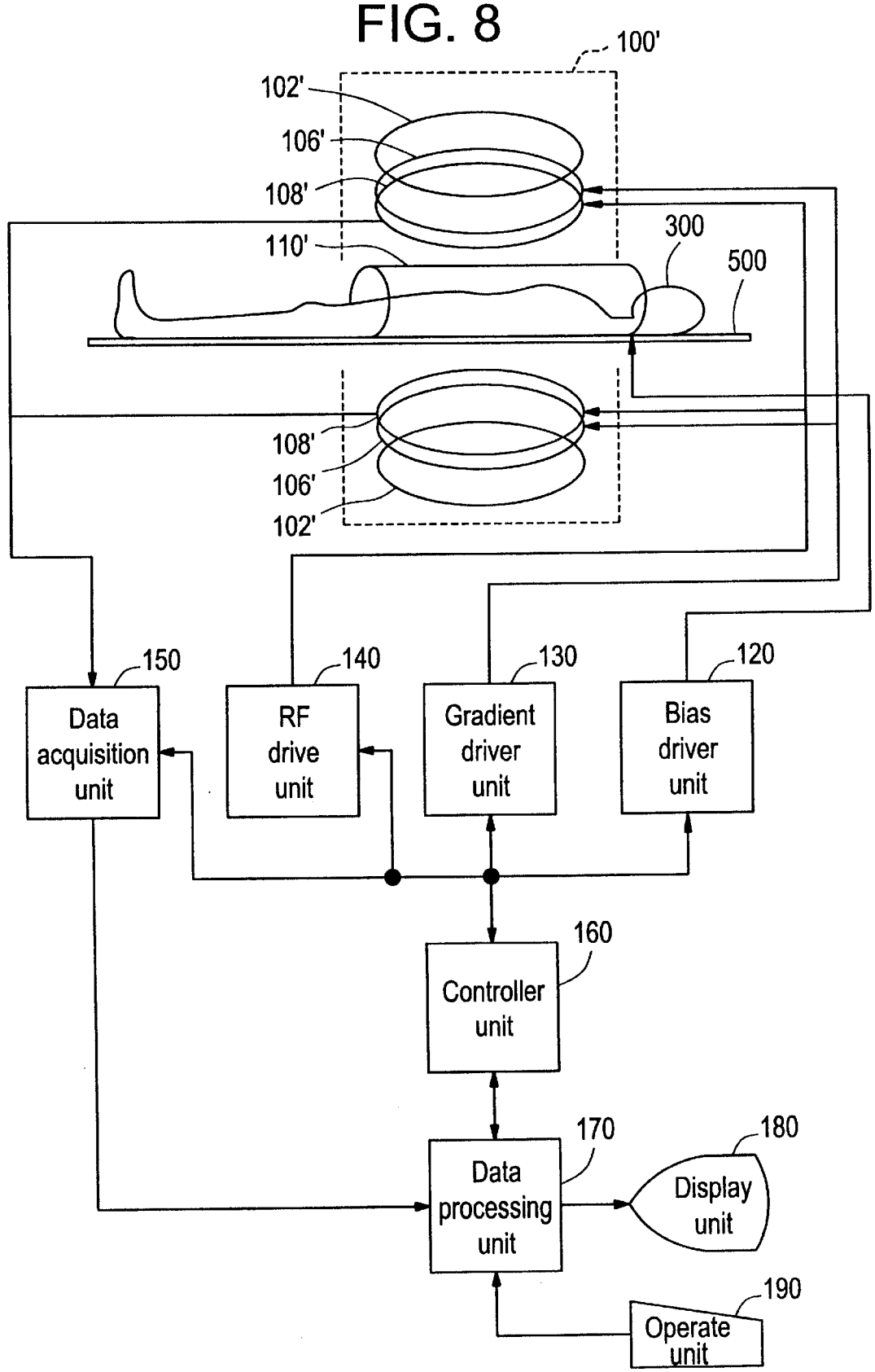

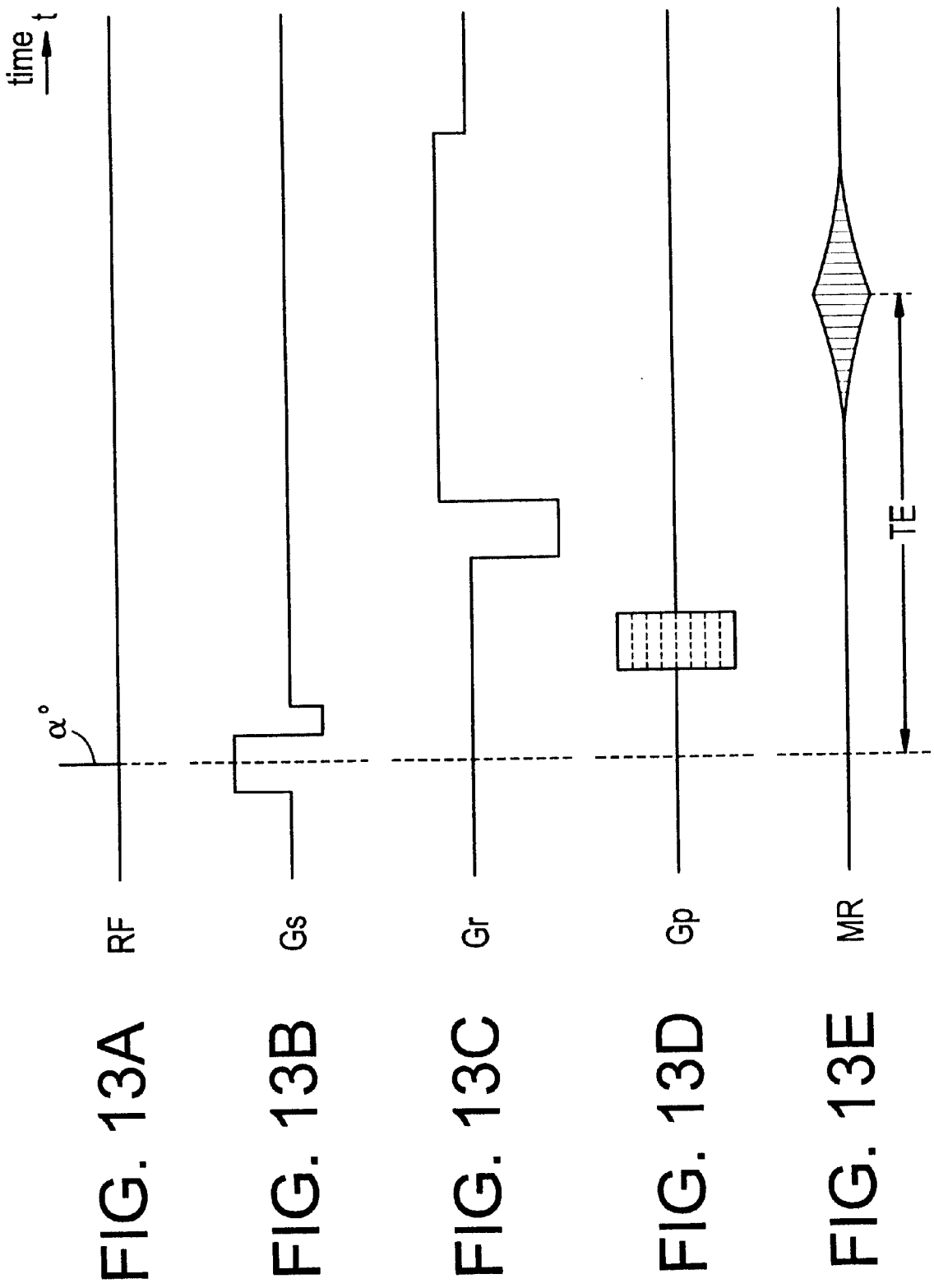

MAGNETIC RESONANCE SIGNAL RECEIVING APPARATUS AND MAGNETIC RESONANCE IMAGING APPARATUS

BACKGROUND OF THE INVENTION

The present invention relates to a magnetic resonance signal receiving apparatus and a magnetic resonance imaging apparatus, and more particularly to a magnetic resonance signal receiving apparatus using a plurality of receiving coils defining a phased array, as well as to a magnetic resonance imaging apparatus using such a magnetic resonance signal receiving apparatus.

In a magnetic resonance imaging apparatus, a receiving coil is placed in the proximity of an imaging object, so as to measure magnetic resonance signals as close to the imaging site as possible in order to improve the signal to noise ratio (SNR) of the signal.

A typical example of the receiving coil of this type is the receiving coil that is used for imaging the spine. The receiving coil is configured of a plurality of coil loops forming a phased array. Since by forming a phased array, each of coil loops may operate respectively as a single coil, an appropriate combination of coil loops may be selected in accordance with the area to be imaged, to image a desired part of spine such as cervical spine, thoracic spine, or lumbar spine and the like.

In a receiving coil as have been described above, there has been a problem that the configuration of selector means for selecting a combination of coil loops may become complex.

SUMMARY OF THE INVENTION

It is therefore an object of the present invention to provide a magnetic resonance signal receiving apparatus which may simplify the configuration of coil loop selector means, as well as a magnetic resonance imaging apparatus which may use such a magnetic resonance signal receiving apparatus.

In a primary aspect of the present invention for solving the problem as have been described above, the present invention provides a magnetic resonance signal receiving apparatus, comprising: a plurality of receiver coils defining a phased array; capacitors each provided in series in a loop of the plural receiver coils; inductors each connected in parallel to the capacitors through a pair of diodes connected in parallel in opposing polarity each other; diodes each provided in series in a loop of the plural receiver coils; and a bias controlling means for enabling receiver coils selected from within the plural receiver coils and disabling others by controlling independently the bias of the diodes.

In a secondary aspect of the present invention, the present invention provides a magnetic resonance imaging apparatus, comprising: static magnetic field formation means for forming static magnetic field in a space housing an imaging object; gradient magnetic field forming means for forming gradient magnetic field in the space; radio frequency magnetic field forming means for forming radio frequency magnetic field in the space; measuring means for measuring magnetic resonance signal from the space; and image generating means for generating images on the basis of the measured the magnetic resonance signals; and the measuring means comprising a plurality of receiver coils defining a phased array; capacitors each provided in series in a loop of the plural receiver coils; inductors each connected in parallel to the capacitors through a pair of diodes connected in parallel in opposing polarity each other; diodes each provided in series in a loop of the plural receiver coils; and a bias controlling means for enabling receiver coils selected from within the plural receiver coils and disabling others by controlling independently the bias of the diodes.

In the present invention, each of receiver coils are controlled to be enabled or disabled at the time of RF excitation as well as at the time of reception of magnetic resonance signal by the application of bias to the diodes in order to select a combination of receiver coils effective for receiving the magnetic resonance signals. Also, the parallel resonance circuit made of a capacitor and an inductor may disable each receiver coil at the time of RF excitation.

In accordance with the present invention, a magnetic resonance signal receiving apparatus with simplified arrangement of coil loop selecting means, as well as a magnetic resonance imaging apparatus using such a magnetic resonance signal receiving apparatus may be achieved.

Further objects and advantages of the present invention will be apparent from the following description of the preferred embodiments of the invention as illustrated in the accompanying drawings.

BRIEF DESCRIPTION OF THE DRAWINGS

FIG. 6 is a schematic diagram indicating the bias application patterns by the bias driver unit shown in FIG. 1.

FIG. 7 is a schematic block diagram of the receiver coil unit in the apparatus shown in FIG. 1.

FIG. 8 is a schematic block diagram of an exemplary embodiment of the apparatus in accordance with the present invention.

FIGS. 13(A)–13(E) are an exemplary pulse sequence to be performed by the apparatus shown in FIG. 1.

DETAILED DESCRIPTION OF THE INVENTION

Figure 1:
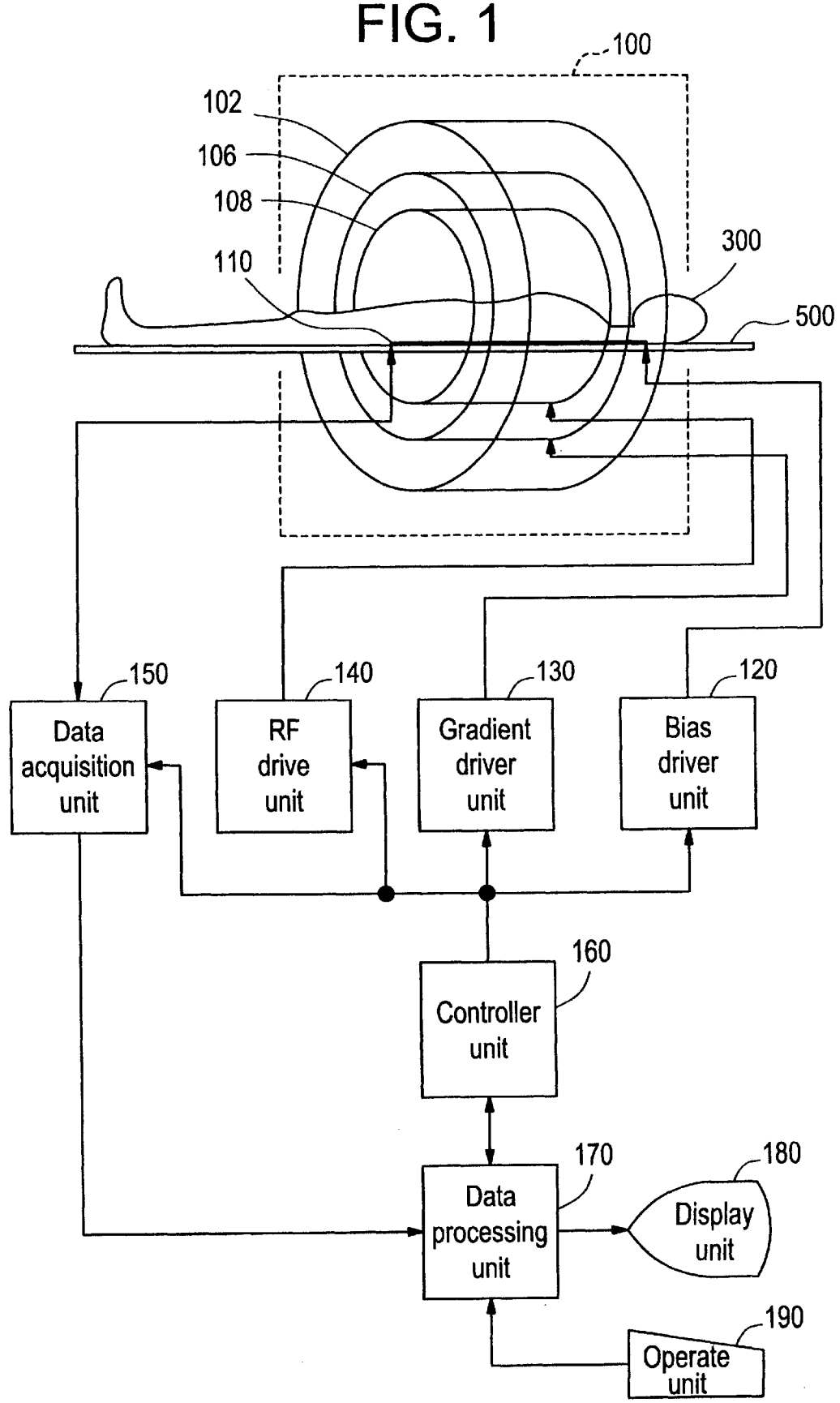
FIG. 1 is a block diagram of a magnetic resonance imaging apparatus.

The best mode for carrying out the present invention will be described in greater details herein below with reference to the accompanying drawings. FIG. 1 shows a block diagram of a magnetic resonance imaging apparatus. This apparatus is an example embodiment of the present invention. An exemplary embodiment with respect to the apparatus in accordance with the present invention may be shown by the arrangement of the apparatus shown.

As shown in FIG. 1, the apparatus has a magnet system 100. The magnet system 100 has a main magnetic field coil unit 102, a gradient coil unit 106, and an RF (radio frequency) coil unit 108. These coil units are in the external form of approximate cylinders, each placed coaxially. In the inner space of the magnet system 100, an imaging object 300 is carried in and out placed on a cradle 500 by means of a transporter means not shown in the figure.

A receiver coil unit 110 is provided to the cradle 500. The receiver coil unit 110 has an outer form of approximately a plate, and is placed on the top surface of the cradle 500. The imaging object 300 may be mounted on the receiver coil unit 110 in the dorsal position. By this, the receiver coil unit 110 may be approached to the pars spinalis of the imaging object 300. The receiver coil unit 110 is constituted of a phased array coil. The phased array coil will be described later.

The main magnetic field coil unit 102 may generate static magnetic field in the inner space of the magnet system 100. The main magnetic field coil unit 102 is a typical example of the static magnetic field forming means .embodiment in accordance with the present invention. The direction of the static magnetic field is approximately parallel to the body axis direction of the imaging object 300. In other words, it generates so-called horizontal magnetic field. The main magnetic field coil unit 102 may be constituted for example by using superconductive coils. It should be understood that the coil unit may not only be constructed of superconductive coils but also may be formed by using a normal conductive coils.

The gradient coil unit 106 may generate gradient magnetic field for setting up a gradient to the static magnetic field intensity. The gradient magnetic field thus generated may be of three types, namely, slice gradient magnetic field, read out gradient magnetic field, and phase encode gradient magnetic field; the gradient coil unit 106 has three gradient coil systems not shown in the figure in correspondence with these three types of gradient magnetic fields.

The RF coil unit 108 may generate RF magnetic field for exciting the spin in the body of the imaging object 300. Forming RF magnetic field may be referred to as sending RF exciting signal, herein below. The receiver coil unit 110 may receives the electromagnetic waves caused by the excited spins, namely the magnetic resonance signal.

A gradient driver unit 130 is connected to the gradient coil unit 106. The gradient driver unit 130 may generate gradient magnetic field by supplying driving signals to the gradient coil unit 106. The part constituted of the gradient coil unit 106 and the gradient driver unit 130 may be a typical example of the gradient magnetic field forming means embodiment in accordance with the present invention. The gradient driver unit 130 has three systems of driving circuits not shown in the figure, corresponding to the three gradient coil systems of the gradient coil unit 106.

An RE driver unit 140 is connected to the RF coil unit 108. The RF driver unit 140 sends RF exciting signals by applying driving signals to the RF coil unit 108 in order to excite the spin in the body of the imaging object 300. The part constituted of the RF coil unit 108 and the RF driver unit 140 may be a typical example of the RF magnetic field forming means embodiment in accordance with the present invention.

A data acquisition unit 150 is connected to the receiver coil unit 110. The part constituted of the receiver coil unit 110 and the data acquisition unit 150 may be a typical example of the measurement means embodiment in accordance with the present invention. The data acquisition unit 150 may capture the receiving signal received by the receiver coil unit 110 to gather signals as digital data.

A bias driver unit 120 is also connected to the receiver coil unit 110. The bias driver unit 120 applies bias signals to the diodes described later belonging to the receiver coil unit 110 to switch between enable and disable of the receiver coils.

The bias driver unit 120, the gradient driver unit 130, the Roe driver unit 140, and the data acquisition unit 150 are connected to a controller unit 160. The controller unit 160 controls each of the bias driver unit 120 to the data acquisition unit 150. The part consisted of the; bias driver unit 120 and the controller unit 160 may be a typical example of the bias controller means embodiment in accordance with the present invention.

The output side of the data acquisition unit 150 is connected to a data processing unit 170. The data processing unit 170 may store data retrieved from the data acquisition unit 150 into a memory not shown in the figure. In the memory data space is defined. The data space may organize two-dimensional Fourier space. The data processing unit 170 may apply two-dimensional invert Fourier transform to these data of two-dimensional Fourier space to reconstruct the image of the imaging object 300. The data processing unit 170 may be a typical example of the image generating means embodiment in accordance with the present invention.

The data processing unit 170 is connected to the controller unit 160. The data processing unit 170 is placed at the top of the controller unit 160 to manage it. The data processing unit 170 is connected to a display unit 180 and an operating unit 190. The display unit 180 may display thus reconstructed image and various information output from the data processing unit 170. The operating unit 190 may be operated by an operator to input to the data processing unit 170 various instructions and information and the like.

Next, the receiver coil unit 110 will be described below. At first, the phased array coil will be described, which constitutes the main part of the receiver coil unit 110. The phased array coil may be formed, for example as shown in FIG. 2, by disposing two unity coils 110-1 and 110-2 each defining a square loop in a partly overlapped manner so as to obtain reception signals without interactive interference from the output terminal 110-1a, 110-1b and 110-2a, 110-2b of respective unity coil.

The overlap may be defined such that the distance L between the centers of both unity coils 110-1c, 110-2c may become 0.9S, where S is the length of one member of loop. When overlapping in this manner, in each loop, the integrated values of flux linkage from the next adjacent coil at the overlapped part and at the non-overlapped part may cancel each other to eliminate interference.

Figure 2:
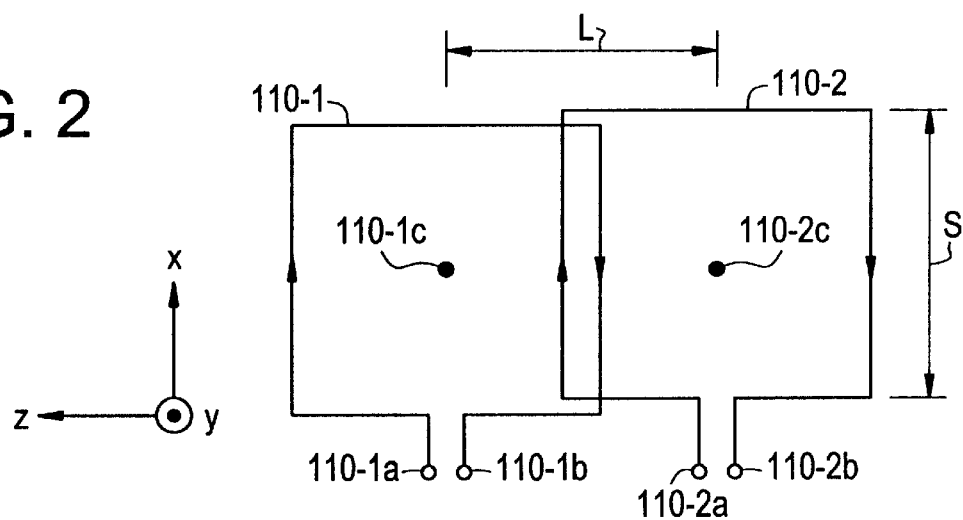
FIG. 2 is an electric circuit diagram indicating the basic arrangement of a phased array coil.

It should be recognized that in FIG. 2, two unity coils 110-1 and 110-2 are depicted as positionally shifted vertically, for the purpose of illustration, in order to facilitate identification of both coils, and that in practice there is no vertical positional shift. At the same time both coils are off course electrically isolated at the overlapped part.

The arrow on the coil loop may indicate the direction of current at a given moment when receiving the magnetic resonance signal in the direction perpendicular to the coil plane. This coil has a sensitivity maximum in the direction perpendicular to the coil plane, and has no sensitivity in the direction parallel to the coil plane. This means that, when defining the direction x as the direction of vertical member of the coil loop, y as the direction of horizontal member, and z as the direction perpendicular to the coil loop, the coil has a directivity such that it has the maximum sensitivity in the z axis, it has no sensitivity in the x and y axis.

Figure 3:
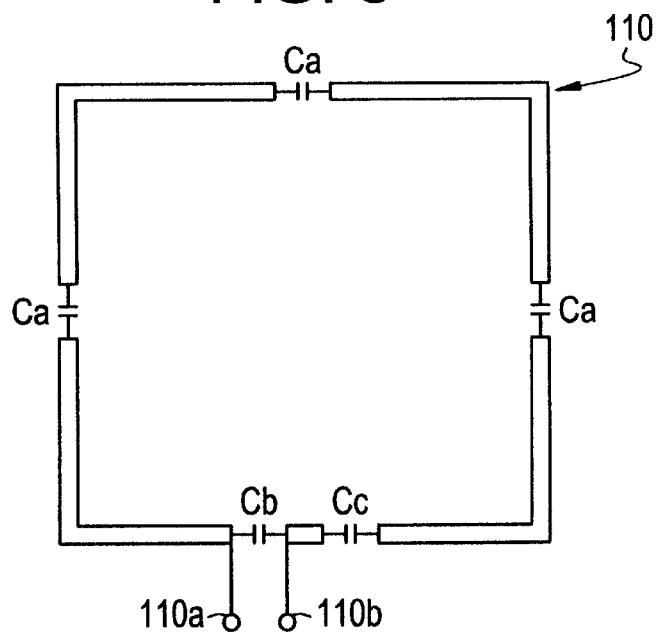
FIG. 3 is an electric circuit diagram of unit coil shown in FIG. 2.

Each of unit coils 110-1, 110-2 practically constitutes a tuning circuit as shown in FIG. 3. That is a LC tuning circuit with the capacitors Ca, Cb, and Cc being connected in series to the coil loop. Then, the reception output signal may be led out from the both ends of the capacitor Cb. The number and position of the capacitors Ca and Cc may be at the discretion.

Figure 4:
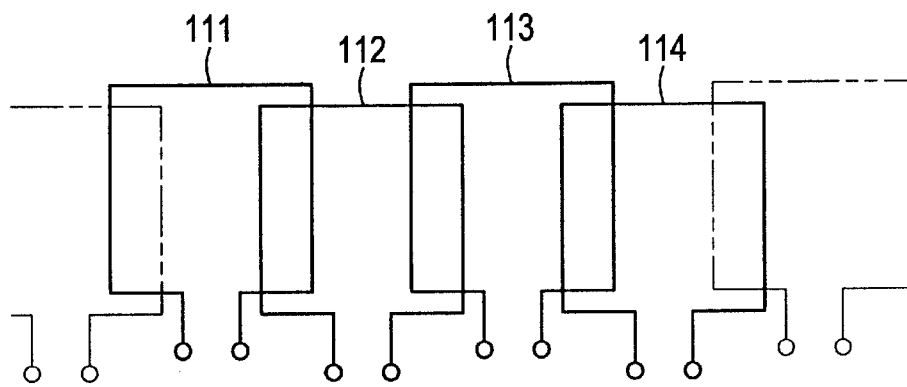
FIG. 4 is an electric circuit diagram indicating a phased array coil.

By taking advantage of the fact that there is no interactive interference between the reception signals from each of unity coils, an array of reception coils (phased array) may be formed by placing, as shown in FIG. 4, in one row a number of unity coils 111, 112, 113, 114, . . . , to receive magnetic resonance signals by each of unity coils from the imaging object thereon placed on the array.

Figure 5:
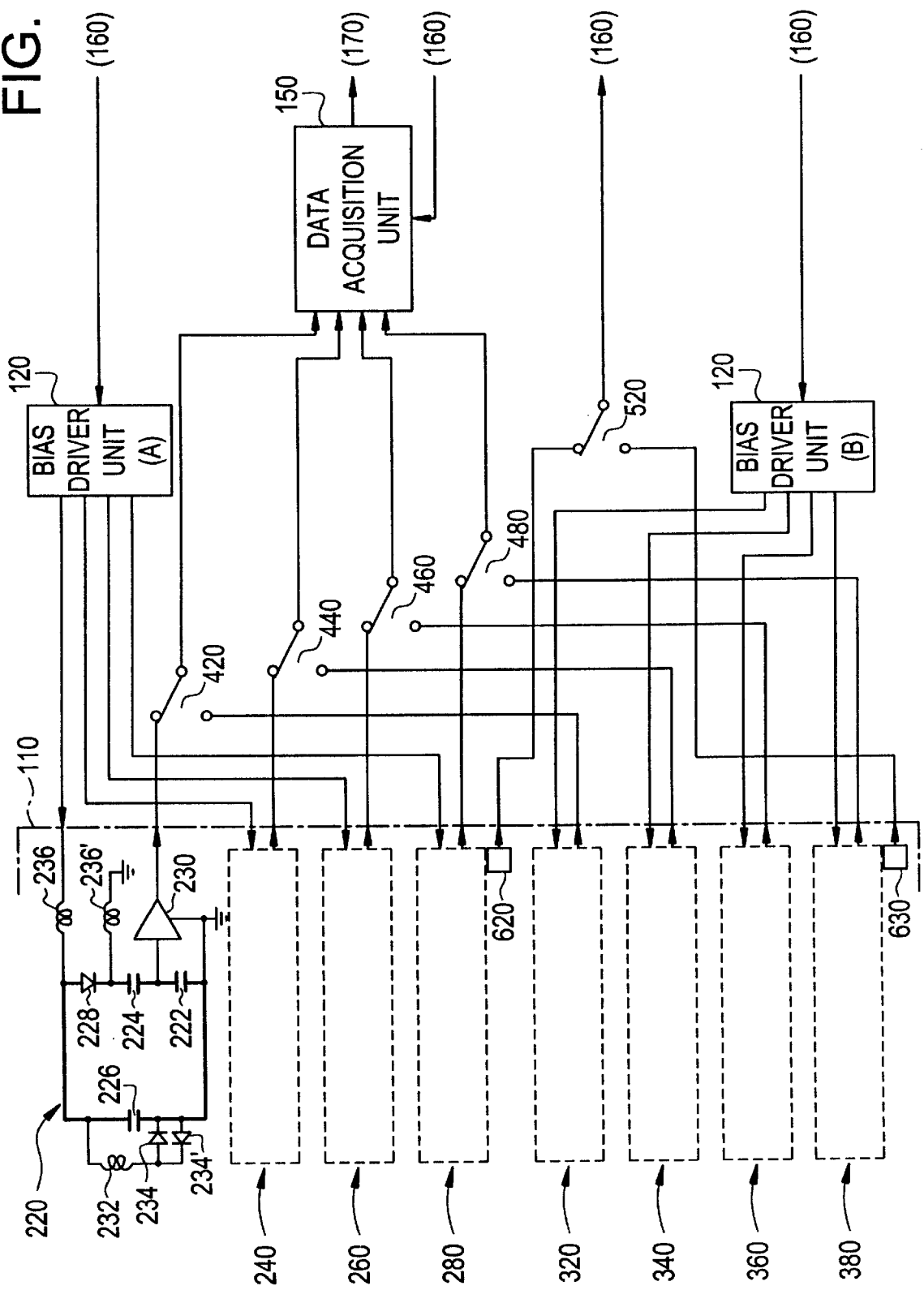
FIG. 5 is a schematic block diagram of receiver coil unit in the apparatus shown in FIG. 1.

FIG. 5 shows a schematic block diagram of the receiver coil unit 110 using a phased array coil as have been described just above in conjunction with the bias driver unit 120 and the data acquisition unit 150. The apparatus made of the receiver coil unit 110 and the bias driver unit 120 may be a typical example of the magnetic resonance signal receiving apparatus embodiment in accordance with the present invention.

As shown in the figure, the receiver coil unit 110 has unity coils 220 through 380. Each of the unity coils 220 through 380 may be respectively a typical example of the receiver coil embodiment in accordance with the present invention. Among these coils, unit coils 220 through 280 may form one system (system A) of phased array coil in such an arrangement as shown in FIG. 4. This system may be for example a phased array coil for imaging the C spine. The remaining unity coils 320 through 380 may also form another system (system B) of phased array. This system may be for example a phased array coil for imaging T and/or L spine.

The circuit arrangement of unity coils 220 through 380 are all identical. Then, the circuit of the unit coil 220 will be depicted as a typical example. The unit coil 220 is a closed loop having capacitors 222, 224, 226 and a diode 228 in series. The reception signal will be output from the both ends of the capacitor 222, through a preamplifier.

To the capacitor 226, an inductor 232 is connected in parallel with the intervention of reversed polarity parallel circuit made of diodes 234 and 234'. The inductor 232 may constitutes a member of an LC parallel circuit together with the capacitor 226 when conducting the diodes 234 and 234'. The capacitor 226 may be a typical example of the capacitor embodiment in accordance with the present invention. The inductor 232 may be a typical example of the inductor embodiment in accordance with the present invention.

To the diodes 228, bias signals from the bias driver unit 120 will be supplied through the inductors 236 and 236'. The inductors 236, 236' may act as an RF choking circuit. The diode 228 may be a typical example of the diode embodiment in accordance with the present invention.

The bias driver unit 120 under the control of the controller unit 160 supplies either the forward bias or the reverse bias to the diode 228. Turning on the diode 228 with the forward bias may close the loop of the unity coil 220 to form a closed loop. On the other hand turning off the diode 228 with the reverse bias to disconnect the loop of the unit coil 220 to form an opened loop.

In the closed loop condition, the current caused by the induction voltage will flow upon reception of magnetic resonance signals so that the voltage generated across the both ends of capacitor 222 will be input to the preamplifier 230. In other words the unit coil 220 is enabled. The induction voltage due to the magnetic resonance signals will not reach to the level for conducting the diodes 234 and 234', so that the parallel circuit of the inductor 232 and the capacitor 226 will not be formed.

In the closed loop condition, when RF exciting signals are transmitted, a large induction voltage caused thereby will conduct the diodes 234 and 234' to form the LC parallel circuit of the inductor 232 and the capacitor 226. Since the resonance frequency of the LC parallel circuit is tuned to the frequency of RF exciting signal, high impedance at the time of parallel resonance will virtually prevent (disable) the current flew through the closed loop to decouple the RF coil unit 108 from the unit coil 220. The LC parallel circuit of this type will be referred to as a passive disabling circuit herein below.

In the open loop condition caused by the reverse bias of the diode 228, the current caused by the induction voltage at the time of receiving magnetic resonance signals will be inhibited so as not to obtain reception signal. In other words the unit coil 220 is disabled. The diode 228 controlled by the bias will be referred to as an active disabling circuit herein below.

In other unit coils 240 through 380, bias signals from the bias driver unit 120 will be respectively supplied to the similar diodes not shown in the figure. It is to be noted that two systems of bias driver unit 120 will be provided in correspondence with two systems of phased array coils so as to each drive respective corresponding system.

The output signals from the preamplifier 230 will be input into one of input terminals of a switcher unit 420. The output signals of the preamplifiers not shown in the figure for other unit coils 240, 260, and 280 in the system A will be also input into respective one of input terminals of the switchers 440, 460, and 480.

The output signals of the preamplifiers not shown in the figure for the unit coils 320 through 380 of the system B will be respectively input into other input terminals of the switcher 420 through 480. The switchers 420 through 480 are cooperatively switched so that the reception signal of either system A or system B will be input into the data acquisition unit 150.

The phased array coil of system A and the phased array coil of system B each have respectively identification signal generators 620 and 630. The identification signals generated thereby will be given as two input signals to the switcher 520. The switcher 520 is cooperative with the switchers 420 through 480 to be switched so as to input the system identification signal of either one system selected by switching to the controller unit 160. The controller unit 160 will recognize based on the input identification signal which system is connected to the data acquisition unit 150.

The switchers 420 through 520 are switched by the operator. Switching may be either manually operated at the installation site of the receiver coil unit 110, or may be remotely operated from the operating unit 190. When performing the remote operation, the identification signal is not necessarily needed to be fed back to the operating unit 190. Also, the switchers 420 through 520 may be either mechanical or electronic.

The controller unit 160 may perform bias control of both systems at the time of transmission of RF excitation signals as well as at the time of reception of magnetic resonance signals, by defining the system connected to the data acquisition unit 150 as the enabled side, and the system not connected as the disabled side.

FIG. 6 shows patterns of bias control performed by the controller unit 160. As shown in the figure, there are tree patterns of bias control. In the pattern (a), upon transmission, the forward biasing of diodes in both the enabled side (for example, system A) as well as the disabled side (for example, system B) will be performed, and upon reception, the enabled side will be forward biased while the disabled side will be reverse biased.

By this, any receiver coils in both systems will become all closed loops at the time of transmission. If RF excitation signals are transmitted in this situation, the induction voltage will form LC parallel circuits in every receiver coils, and the high impedance of parallel resonance will decouple the LC circuits from the RF coil unit 108.

On the other hand, upon reception, the enabled side will become closed loop, while the disabled side will be opened. Therefore the reception of magnetic resonance signals will be performed only by the enabled side.

In such a pattern (a), since both systems may be forward biased at the time of transmission, and the decoupling with respect to the RF coil unit 108 may be performed by the passive disabling circuit, so that the diodes used for the active disabling circuit can be the inexpensive ones with low breakdown voltage.

In the pattern (b), the enabled side will be forward biased and the disabled side will be reverse biased at the time of transmission, while the enabled side will be forward biased and the disabled side will be reverse biased at the time of reception.

By this, the receiver coils in the enabled side will be closed loops, and the receiver coils in the disabled side will be opened loop at the time of transmission. If the RF excitation signals will be transmitted in this condition, the passive disabling circuit in the enabled side will perform the decoupling with the RF coil unit 108, while the active disabling circuit in the disabled side will perform the decoupling with the RF coil unit 108.

Upon reception, as similar to the pattern (a), the enabled side will be closed loop, the disabled side will be opened loop. Therefore the reception of magnetic resonance signals will be performed only by the enabled side.

In the pattern (b) the disabled side will be decoupled by the active disabling circuit at the time of transmission so that the decoupling will be more complete than the case of pattern (a).

In the pattern (c), both systems will be reverse biased upon transmission, while upon reception the enabled side will be forward biased and the disabled side will be reverse biased. By this, the receiver coils in both systems will be all opened loop upon transmission. If the RF excitation signals is transmitted in this condition, the receiver coils of both systems will be decoupled from the RFcoil unit 108 by the active disabling circuit.

Upon reception, as similar to the pattern (a), the enabled side will be closed loop, and the disabled side will be opened loop. Therefore the reception of magnetic resonance signals will be performed only by the enabled side.

In the pattern (c) both systems will be decoupled by the active disabling circuit at the time of transmission, so that the decoupling will be far more complete than the pattern (b).

In any of patterns as have been described above, since the receiver systems is enabled or disabled by the bias control of the diodes, the selector means of receiver system may be realized with a simplified arrangement.

The receiver coil unit 110 may not necessarily need to be split into two systems; the entire unit may be only one single system, and the receiver coil may be formed by selecting some desired unit coils therefrom. FIG. 7 shows a schematic block diagram of the receiver coil unit 110 of such configuration.

As shown in FIG. 7, the switchers 420 through 480 may select four (or less) arbitrary unit coils to be enabled. Then, at the time of transmission and reception the bias driver unit 120 controls the bias of each of unit coils 220 through 380 independently to enable the appropriate unit coils and to disable other unit coils.

FIG. 8 shows a schematic block diagram of a magnetic resonance imaging apparatus. The present apparatus may be a typical example of the embodiment in accordance with the present invention. The configuration of this apparatus may indicate one exemplary embodiment with respect to the apparatus in accordance with the present invention.

The apparatus shown in FIG. 8 has a magnet system 100' and a receiver coil unit 110', different from the apparatus shown in FIG. 1. Other parts are similar to the apparatus shown in FIG. 1, the same reference numerals designate to the similar member to omit the description.

The magnet system 100' has a main magnetic field coil unit 102', a gradient coil unit 106' and an RF coil unit 108'. These main magnetic field coil unit 102' and respective coil units may be formed of a pair mutually opposed each to other across a space. Also, every units have an outer form of disks and are positioned around the central axis shared. In the inner space of the magnet system 100' an imaging object 300 is carried in and out placed on a cradle 500 by means of a transporter means not shown in the figure.

A receiver coil unit 110' is provided to the cradle 500. The receiver coil unit 110' has broadly an outer form of cylinder, and is placed on the top surface of the cradle 500. The imaging object 300 may be mounted in the cylinder of the receiver coil unit 110' in the dorsal position. By this the receiver coil unit 110' may be approached to the pars spinalis of the imaging object 300. The receiver coil unit 110' is constituted of a phased array coil. The phased array coil will be described later.

The main magnetic field coil unit 102' may generate static magnetic field in the inner space of the magnet system 100'. The direction of the static magnetic field is approximately perpendicular to the body axis direction of the imaging object 300. In other words, it generates so-called vertical magnetic field. The main magnetic field coil unit 102' maybe constituted for example by using permanent magnets and the like. It should be understood that the coil unit may not only be constructed of permanent magnets but also may be formed by using superconductive magnets or an ordinary conductive electromagnets.

The gradient coil unit 106' may generate gradient magnetic field for setting up a gradient to the static magnetic field intensity. The gradient magnetic field thus generated may be of three types, namely, slice gradient magnetic field, read out gradient magnetic field, and phase encode gradient magnetic field; the gradient coil unit 106' has three gradient coil systems not shown in the figure in correspondence with these three types of gradient magnetic fields.

The RF coil unit 108' may generate RF exciting signals for exciting the spin in the body of the imaging object 300. The receiver coil unit 110' may receive the magnetic resonance signals caused by the excited spins.

Next the receiver coil unit 110' will be described. At first, the phased array coils, which constitutes the main part of the receiver coil unit 110' will be described.

Figure 9:
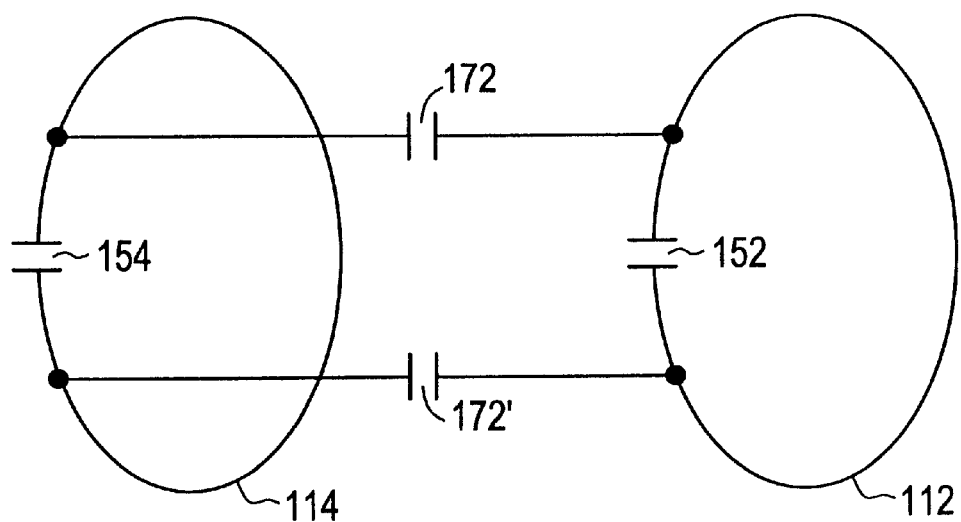
FIG. 9 is an electric circuit diagram indicating the basic arrangement of a phased array coil.

FIG. 9 shows a basic form of a phased array coil. As shown in the figure, a unit coil 112 is a closed loop having a capacitor 152. There may also be other capacitors than the capacitor 152. A unit coil 114 is a closed loop having a capacitor 154. There may also be other capacitors than the capacitor 154. The receiving signals of these unit coils 112 and 114 may be led out from the terminals across the capacitors 152 and 154.

The loop of the unit coil 112 and the loop of the unit coil 114 are mutually connected by a capacitor 172 and 172', both loops are electrostatically coupled. Here the capacitance of the capacitor 172 and 172' may be selected such that the current flew through both loops there through may cancel out the current flew through both loops by the electromagnetic coupling. By this, the loop of the unit coil 112 and the loop of the unit coil 114 are decoupled each from other, so that one will not be affected by the other. That is, the unit coil 112 and the unit coil 114 constitute a phased array coil. A plurality of unity coils in such relationship are arranged on the cradle 500 at a predetermined interval with the loop plane being opposed each other.

Figure 10:
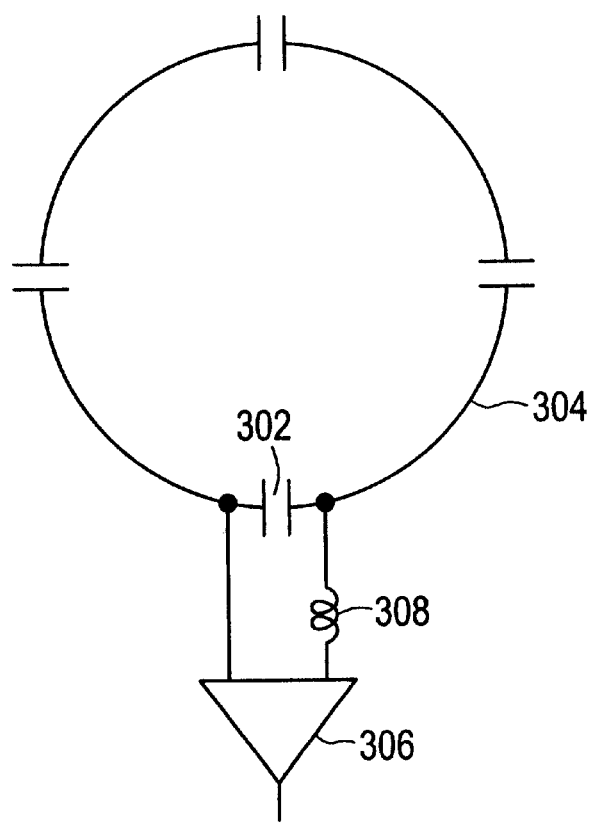
FIG. 10 is an electric circuit diagram indicating the basic arrangement of a phased array coil.

FIG. 10 shows an electric circuitry of a unit coil in another form used for the phased array. As shown in the figure, the unit coil is constituted of a series connection of a capacitor 302 and a conductor 304. A reference numeral is labeled representatively on the capacitor and the conductor. The number of capacitors 302 is not limited to four as shown in the figure, but may be any appropriate.

On both terminals of one capacitor 302 the input circuit of a preamplifier 306 for amplifying the magnetic resonance signals received by the unit coil is connected through an inductor 308. For the preamplifier 306 an amplifier having sufficiently lower impedance at the input circuit, namely a low input impedance amplifier will be used.

In such a unit coil, since the preamplifier 306 is a low input impedance amplifier, an LC parallel circuit of the capacitor 302 and the inductor 308 is substantially formed. Here the resonance frequency of the LC parallel circuit is selected so as to match with the frequency of the magnetic resonance signals. Because of this, at the time of reception of magnetic resonance signals the LC parallel circuit will resonate, and the high impedance thereby will cause the unit coil to be substantially open loop.

Figure 11:
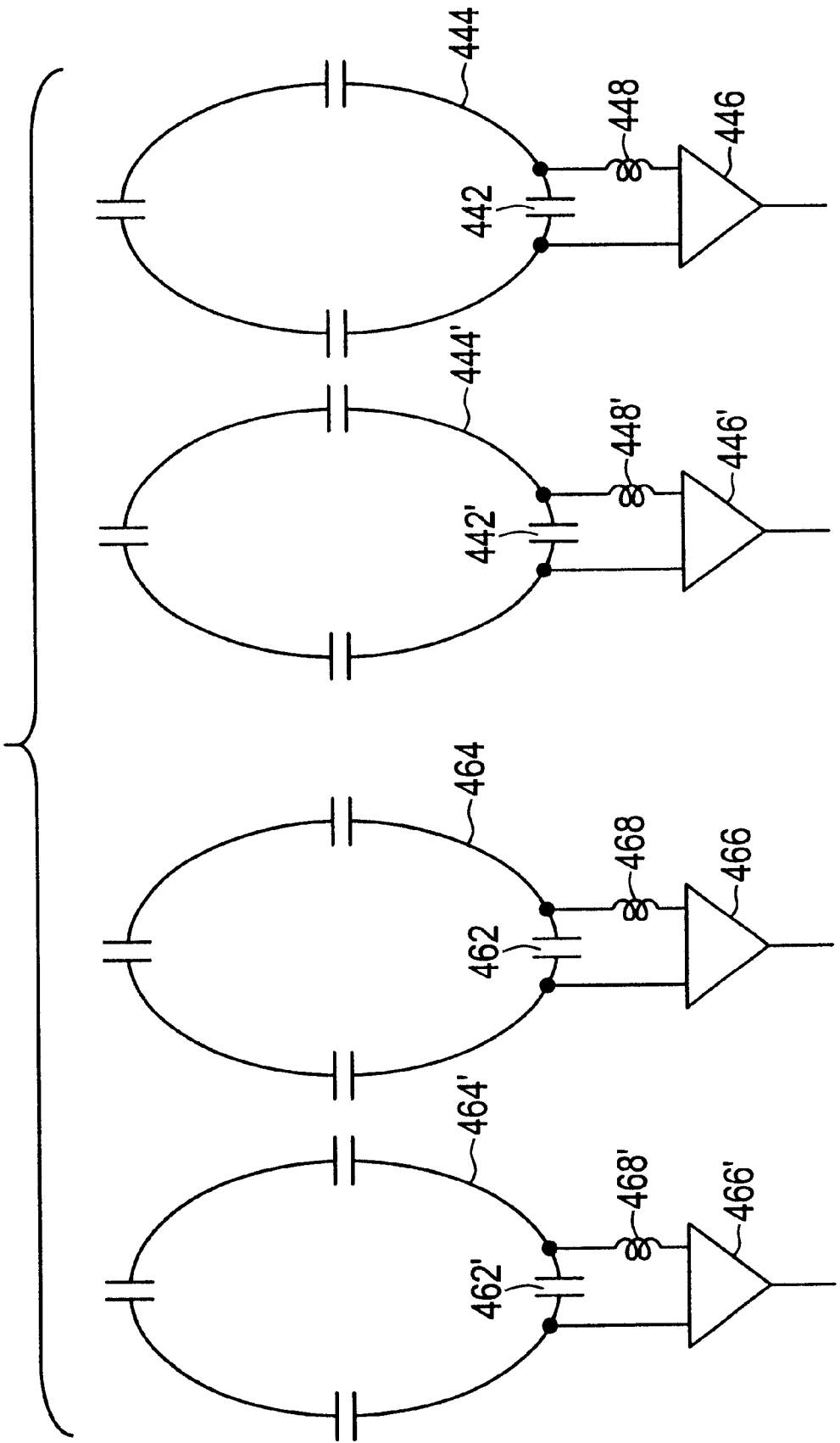
FIG. 11 is an electric circuit diagram indicating a phased array coil.

Unit coils of such configuration are provided on the cradle 500 at a predetermined interval, with the loop plane being opposed each other. The electric circuit diagram of a plurality of unit coils in the state of being provided on the cradle 500 is shown in FIG. 11. The FIG. 11 indicates a perspective view of loop planes of each coils.

Every unit coils will be substantially opened loop due to the high impedance caused by the parallel resonance of the LC circuit. Since every unit coils become all substantially opened loop at the time of reception as such, there will not be a coupling therebetween. Because of such decoupling, each of unit coils, which may be conformed to be independently present, may respectively receive magnetic resonance signals without affection of neighboring unit coils. This means that these unit coils forms a phased array coil.

The receiver coil unit 110' may be formed by using the phased array coil of the type shown in FIG. 9 or of the type shown in FIG. 11. The phased array coil may be formed of two systems, each using four unit coils, as shown in FIG. 5. Then for each unit coil a passive disabling circuit of LC parallel circuit and an active disabling circuit of diodes and bias driver unit, as shown in FIG. 5, will be provided to control as have been described above from the bias driver unit 120 so as to receive the magnetic resonance signals from a desired system.

The operation of the apparatus in accordance with the present invention will be described. In operation, there is no essential difference between the apparatus shown in FIG. 1 and the apparatus shown in FIG. 8. The operation of the present apparatus proceed under the control of the controller unit 160. The controller unit 160 may identify the used one between two systems of phased array coils based on the identification signals, to effectuate the imaging while controlling the enabled and/or disabled status of both systems as have been described above.

FIGS. 12(A)–12(E) show an exemplary pulse sequence used for the magnetic resonance imaging. The pulse sequence shown is a pulse sequence for the Spinning Echo (SE) method.

Figures 12A, 12B, 12C, 12D, 12E:
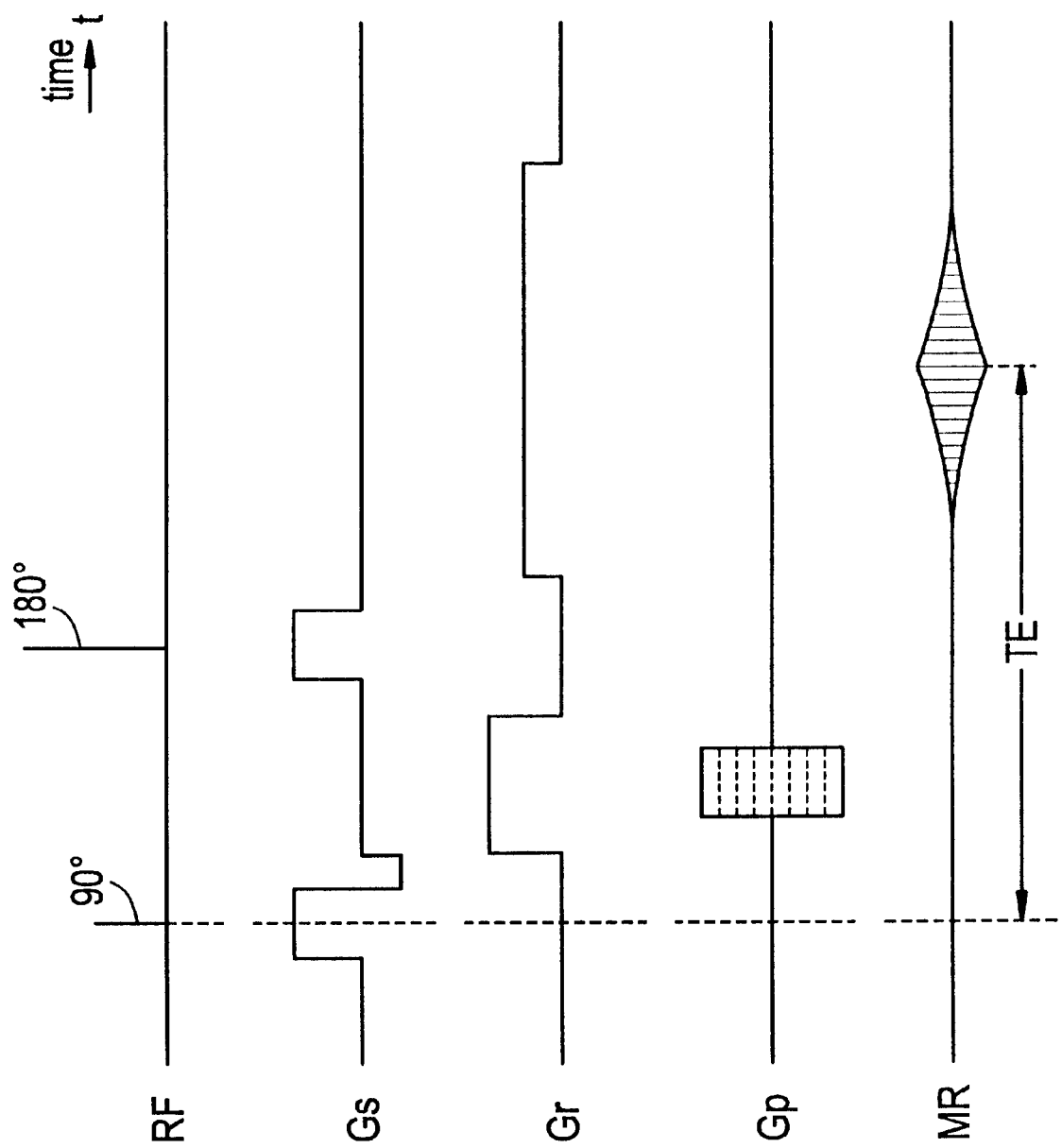
FIGS. 12(A)–12(E) are an exemplary pulse sequence to be performed by the apparatus shown in FIG. 1.

More specifically, FIG. 12(A) is a pulse sequence of 90 degrees and 180 degrees pulses for RF excitation in the SE method;

FIGS. 12(B)–12(E) are sequences for the slice gradient Gs, read out gradient gr, phase encode gradient Gp, and spinning echo MR, respectively. The pulses at 90 degrees and 180 degrees may be represented by their respective center signals. The pulse sequence proceeds from the left hand side to the right hand side along with the time base t.

As shown in the figure, the 90 degrees pulse may perform the 90 degrees excitation of spin. At this moment slice gradient Gs will be applied so as to perform selective excitation with respect to a predetermined slice. A predetermined period of time after the 90 degrees excitation, the 180 degrees excitation by the 180 degrees pulse, namely the spin inversion will be performed. At this moment also slice gradient Gr may be applied, so as to perform selective excitation with respect to the same slice.

During the period of time between the 90 degrees excitation and the spin inversion, read out gradient Grand phase encode gradient Gp may be applied. The read out gradient Gr causes the spin to be dephased. The phase encode gradient Gp causes the spin to be phase encoded.

After the spin inversion, the spin echo MR may be generated by rephasing the spin with the read out gradient Gr. The spin echo MR will become RF signals having the symmetric wave shape with respect to the echo center. The center echo will arise TE (echo time) after the 90 degrees excitation. The spin echo MR will be retrieved by the data acquisition unit 150 as view data. Such a pulse sequence will be iteratively repeated for 64 to 512 times at a frequency TR (repetition time). For each repetition phase encode gradient Gp will be modified to perform a phase encode different each time. By this view data comprising 64 through 512 views may be obtained.

Another example of pulse sequence for the magnetic resonance imaging is shown in FIGS. 13(A)–13(E) This pulse sequence is a pulse sequence for the Gradient Echo (GRE) method.

More specifically, FIG. 13(A) is a pulse sequence of $\alpha°$ pulse for RF excitation in the GRE method; similarly FIGS. 13(B)–13(E) are sequences for slice gradient Gs, read out gradient Gr, phase encode gradient Gp, and spin echo MR, respectively. Here the $\alpha°$ pulse may be represented by the center signal. The pulse sequence proceeds from the left hand side to the right hand side along with the time base t.

As shown in the figure, the $\alpha°$ pulse may excite spins at $\alpha°$. $\alpha$ is equal to or less than 90. At this moment the slice gradient Gs will be applied so as to perform selective excitation with respect to a predetermined slice.

After $\alpha°$ excitation, the phase encode gradient Gp will phase encode the spin. Then the read out gradient Gr will dephase the spin at first, and then rephase the spin again to generate the gradient echo MR. The gradient echo MR will become RF signals having a symmetric wave shape around the echo center. The central echo will arise TE (echo time) after the $\alpha°$ excitation.

The gradient echo MR will be retrieved by the data acquisition unit 150 as view data. Such a pulse sequence will be iteratively repeated for 64 to 512 times at a frequency TR. For each repetition phase encode gradient Gp will be modified to perform a phase encode different each time. By this view data comprising 64 through 512 views may be obtained.

View data obtained by the pulse sequence of FIG. 12 or FIG. 13 will be stored in the memory of the data processing unit 170. It should be noted that the pulse sequence is not limited to the SE method or the GRE method, any other appropriate methodologies such as for example Fast Spin Echo (FSE) method, Echo Planar Imaging (EPI) method may be used as well.

The data processing unit 170 will perform two-dimensional invert Fourier transform of view data to reconstruct the sectional images of the imaging object 300. Thus reconstructed sectional images will be displayed by the display unit 180 as the visible images. On the display unit 180 the sectional image of for example C spine or T/L spine will be displayed.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance signal receiving apparatus comprising:
    a plurality of receiver coil units disposed with respect to each other to define a phase array, each unit of said plurality of receiver coils defining a loop;
    a plurality of capacitors each provided in series in each loop of each unit of said plurality of receiver coils;
    a plurality of first diodes;
    a plurality of inductors each connected in parallel to each of said plurality of capacitors in each said loop through a pair of said plurality of first diodes connected in parallel in opposing polarity to each other;
    a plurality of second diodes each provided in series in said loop of each unit of said plurality of receiver coils; and
    means for enabling selective ones of said units of said plurality of receiver coils and for disabling others of said units of said plurality of receiver coils by independently and selectively controlling bias of said plurality of said second diodes provided in said loop of each unit of said plurality of receiver coils so that signals received by said units of said plurality of receiver coils are selectively controlled in desired combinations to thereby simplify signal receipt, said means being connected to each unit of said plurality of receiver coils and to each of said plurality of second diodes connected in said loop thereof.

2. The apparatus of claim 1, wherein number of units of said plurality of receiver coils is equal to or more than five, and wherein number of said selected ones of said units of said plurality of receiver coils is equal to or less than four.

3. The apparatus of claim 1, wherein each of said units of said plurality of receiver coils comprises a receiving signal unit and an LC parallel circuit therein.

4. The apparatus of claim 1, wherein each of said units of said plurality of receiver coils comprises a loop plane over-lapping partially an adjoining loop plane of an adjoining unit.

5. The apparatus of claim 1, wherein each unit of said plurality of receiver coils is connected to an adjoining unit by a capacitor.

6. A magnetic resonance imaging apparatus comprising:
    first means for forming a static magnetic field in a space for placement of an imaging object;
    second means for forming a gradient magnetic field in said space;
    third means for forming radio frequency magnetic field in said space;
    fourth means for measuring magnetic resonance signal emanating from said space; and
    fifth means for generating images on basis of said measured magnetic resonance signal;
    wherein said fourth means comprises:
        a plurality of receiver coil units disposed with respect to each other to define a phase array, each unit of said plurality of receiver coils defining a loop;
        a plurality of capacitors each provided in series in each loop of each unit of said plurality of receiver coils;
        a plurality of first diodes;
        a plurality of inductors each connected in parallel to each of said plurality of capacitors in each said loop through a pair of said plurality of first diodes connected in parallel in opposing polarity to each other;
        a plurality of second diodes each provided in series in said loop of each unit of said plurality of receiver coils; and
        means for enabling selective ones of said units of said plurality of receiver coils and for disabling others of said units of said plurality of receiver coils by independently and selectively controlling bias of said plurality of said second diodes provided in said loop of each unit of said plurality of receiver coils so that signals received by said units of said plurality of receiver coils are selectively controlled in desired combinations to thereby simplify signal receipt, said means being connected to each unit of said plurality of receiver coils and to each of said plurality of second diodes connected to said loop thereof.

7. The apparatus of claim 6, wherein number of units of said plurality of receiver coils is equal to or more than five, and wherein number of said selected ones of said unit of said plurality of receiver coils is equal to or less than four.

8. The apparatus of claim 6, wherein each of said units of said Plurality of receiver coils comprises a receiving signal unit, and an LC parallel circuit therein.

9. The apparatus of claim 6, wherein each of said units of said plurality of receiver coils comprises a loop plane over-lapping partially an adjoining loop plane of an adjoining unit.

10. The apparatus of claim 6, wherein each unit of said plurality of receiver coils is connected to an adjoining unit by a capacitor.

11. The apparatus of claim 6, wherein said selected ones of said units of said plurality of receiver coils are one half of said units of said plurality of receiver coils.

12. The apparatus of claim 6, wherein said selected ones of said units of said plurality of receiver coils are one half of said units of said plurality of receivere coils.

* * * * *